US011211517B2

(12) United States Patent
Sorabji et al.

(10) Patent No.: US 11,211,517 B2
(45) Date of Patent: *Dec. 28, 2021

(54) PRESSURIZED HEATED ROLLING PRESS FOR MANUFACTURE AND METHOD OF USE

(71) Applicant: UTICA LEASECO, LLC, Rochester Hills, MI (US)

(72) Inventors: Khurshed Sorabji, San Jose, CA (US); Steven Yoshida, Mountain View, CA (US); Eric Sanford, Belmont, CA (US)

(73) Assignee: UTICA LEASECO, LLC, Rochester Hills, MI (US)

(*) Notice: Subject to any disclaimer, the term of this patent is extended or adjusted under 35 U.S.C. 154(b) by 726 days.

This patent is subject to a terminal disclaimer.

(21) Appl. No.: 15/934,380

(22) Filed: Mar. 23, 2018

(65) Prior Publication Data
US 2018/0212093 A1 Jul. 26, 2018

Related U.S. Application Data

(63) Continuation of application No. 15/191,375, filed on Jun. 23, 2016, and a continuation of application No.
(Continued)

(51) Int. Cl.
H01L 31/18 (2006.01)
H01L 21/67 (2006.01)
(Continued)

(52) U.S. Cl.
CPC .......... H01L 31/1876 (2013.01); B65G 15/16 (2013.01); B65G 21/2036 (2013.01);
(Continued)

(58) Field of Classification Search
CPC ................. H01L 31/1876; H01L 31/18; H01L 21/67115; H01L 21/67173; H01L 21/6776;
(Continued)

(56) References Cited

U.S. PATENT DOCUMENTS 3,945,789 A 3/1976 Boman
6,159,763 A 12/2000 Sakai et al.
(Continued)

FOREIGN PATENT DOCUMENTS

CN 102610700 A 7/2012
CN 103038653 A 4/2013
(Continued)

OTHER PUBLICATIONS

European Search Report corresponding to European Application No. 19176222.8, dated Aug. 29, 2019.
(Continued)

Primary Examiner — Cynthia L Schaller
(74) Attorney, Agent, or Firm — Arent Fox LLP

(57) ABSTRACT

A system for connecting photovoltaic cells is disclosed. The system comprises a flexible component feeder source for feeding the photovoltaic cells to a process that couples them together; a vacuum conveyor for receiving at a first location the coupled photovoltaic cells and including openings through which a vacuum is applied to hold the coupled photovoltaic cells in place; a moving belt above the vacuum conveyor at a second location, where the vacuum conveyor and the moving belt are driven in a predetermined relation to one another for conveying the coupled photovoltaic cells from the first location to the second location; a vacuum source for applying a vacuum through the openings to cause the moving belt to apply a pressure to an upper surface of the coupled photovoltaic cells to compress the coupled photo-
(Continued)

voltaic cells; and a curing source at the second location for curing the compressed coupled photovoltaic cells.

34 Claims, 6 Drawing Sheets

Related U.S. Application Data

15/191,410, filed on Jun. 23, 2016, now Pat. No. 10,076,896.

(60) Provisional application No. 62/184,712, filed on Jun. 25, 2015.

(51) Int. Cl.
| | | |
|---|---|---|
| *H01L 21/683* | (2006.01) | |
| *H01L 21/677* | (2006.01) | |
| *B65G 15/16* | (2006.01) | |
| *B65G 21/20* | (2006.01) | |
| *F16B 47/00* | (2006.01) | |

(52) U.S. Cl.
CPC ........ *F16B 47/003* (2013.01); *H01L 21/6776* (2013.01); *H01L 21/67115* (2013.01); *H01L 21/67132* (2013.01); *H01L 21/67173* (2013.01); *H01L 21/6838* (2013.01); *H01L 31/18* (2013.01); *H01L 31/186* (2013.01)

(58) Field of Classification Search
CPC ............... H01L 21/6838; H01L 31/186; H01L 21/67132; H01L 31/188; B65G 15/16; B65G 21/2036; F16B 47/003; Y02E 10/50
See application file for complete search history.

(56) References Cited

U.S. PATENT DOCUMENTS

| | | | |
|---|---|---|---|
| 6,703,102 B1 | 3/2004 | Prescott | |
| 7,004,309 B2 | 2/2006 | Sherwood | |
| 8,152,044 B2* | 4/2012 | Kawagoe | H01L 31/188 228/47.1 |
| 8,209,919 B2 | 7/2012 | Beck | |
| 9,356,184 B2 | 5/2016 | Morad et al. | |
| 10,076,896 B2* | 9/2018 | Sorabji | H01L 31/1864 |
| 2002/0046764 A1 | 4/2002 | Ansley et al. | |
| 2004/0131760 A1 | 7/2004 | Shakespeare | |
| 2004/0131761 A1 | 7/2004 | Shakespeare | |
| 2006/0028166 A1 | 2/2006 | Closset et al. | |
| 2008/0081178 A1 | 4/2008 | Hinotsu et al. | |
| 2008/0264465 A1 | 10/2008 | Kerr et al. | |
| 2008/0314434 A1 | 12/2008 | Khouri et al. | |
| 2009/0139562 A1 | 6/2009 | Thomas | |
| 2009/0308380 A1 | 12/2009 | Palmer | |
| 2011/0111173 A1 | 5/2011 | Ogawa et al. | |
| 2011/0239450 A1* | 10/2011 | Basol | H01L 31/048 29/738 |
| 2012/0067701 A1 | 3/2012 | Steffen | |
| 2012/0090659 A1 | 4/2012 | Muchow et al. | |
| 2012/0118493 A1 | 5/2012 | Kalkanoglu et al. | |
| 2012/0152306 A1 | 6/2012 | Iqbal et al. | |
| 2013/0171757 A1* | 7/2013 | Ponnekanti | C23C 14/568 438/57 |
| 2013/0206213 A1 | 8/2013 | He et al. | |
| 2015/0365046 A1 | 12/2015 | Lerner et al. | |
| 2016/0380125 A1 | 12/2016 | Snaith et al. | |
| 2019/0120525 A1 | 4/2019 | Morris | |

FOREIGN PATENT DOCUMENTS

| | | |
|---|---|---|
| CN | 103053032 A | 4/2013 |
| EP | 0031724 A2 | 7/1981 |
| EP | 1644989 B9 | 4/2012 |
| JP | 2006-120998 A | 5/2006 |
| JP | 2006120998 A | 5/2006 |
| JP | 2013183101 A | 9/2013 |
| WO | 2007080822 A1 | 7/2007 |
| WO | 2014046810 A1 | 3/2014 |
| WO | WO 2014/046810 A1 | 3/2014 |

OTHER PUBLICATIONS

European Search Report corresponding to European Application No. 19176210.3, dated Sep. 5, 2019.
U.S. Non-Final Office Action dated Nov. 5, 2018 dated in co-pending U.S. Appl. No. 15/191,375.
International Search Report and Written Opinion issued in International Patent Application No. PCT/US2016/039411 dated Jan. 12, 2017 (10 pages).
International Search Report and Written Opinion issued in International Patent Application No. PCT/US2016/039417 dated Oct. 24, 2016, 12 pages.
The International Preliminary Report on Patentability issued in International Patent Application No. PCT/US2016/039411, dated Jul. 31, 2017 (15 pages).
Written Opinion of the International Preliminary Examining Authority issued in International Patent Application No. PCT/US2016/039417, dated May 22, 2017 (7 pages).
Written Opinion of the International Preliminary Examining Authority issued in International Patent Application PCT/US2016/039411 dated May 18, 2017 (5 pages).
Chinese Office Action dated Jun. 2, 2021 issued in Chinese counterpart Application No. CN201680045097.5.

* cited by examiner

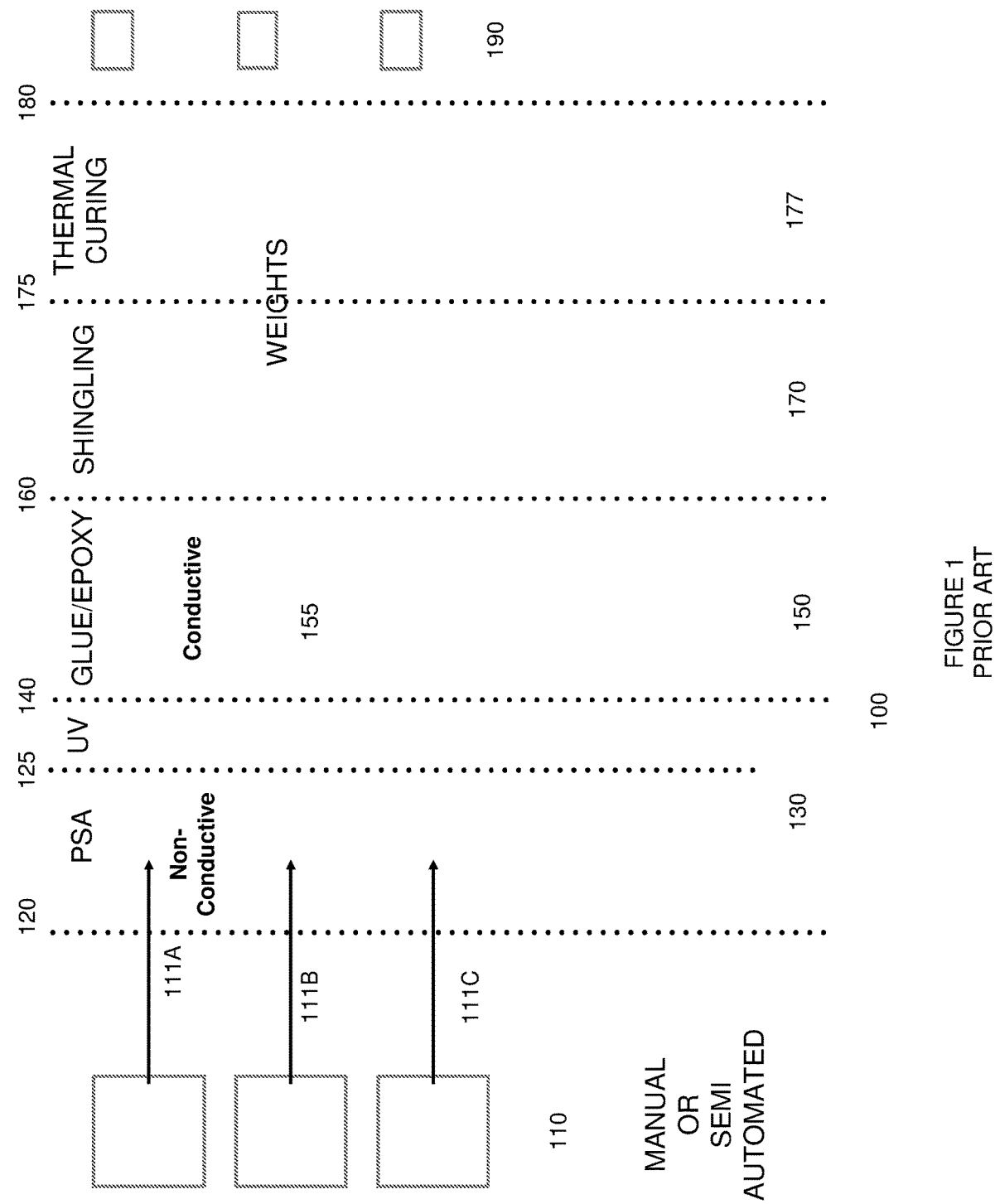

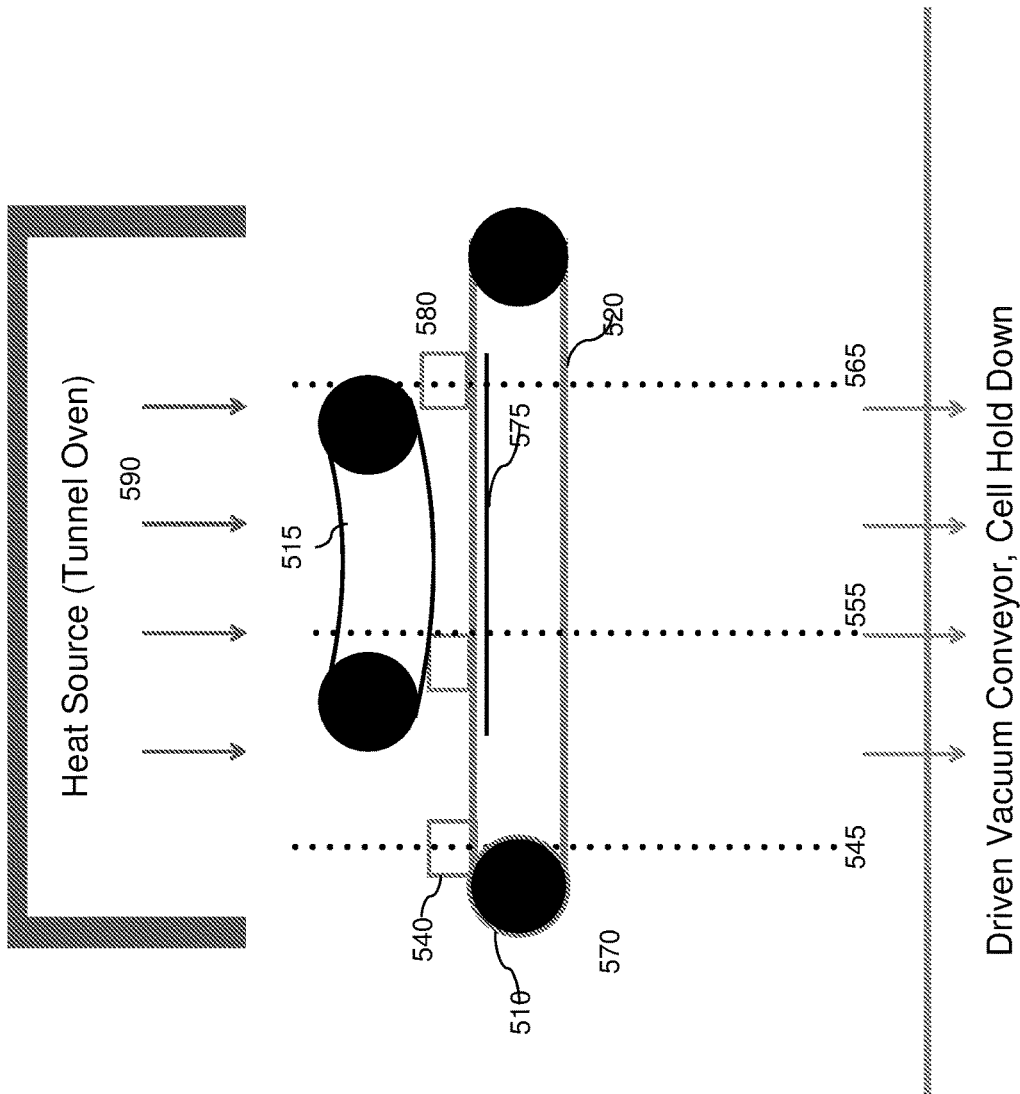

PRESSURIZED HEATED ROLLING PRESS FOR MANUFACTURE AND METHOD OF USE

CROSS-REFERENCE TO RELATED APPLICATIONS

The present application is a Continuation of U.S. patent application Ser. No. 15/191,375, entitled "PRESSURIZED HEATED ROLLING PRESS FOR MANUFACTURE AND METHOD OF USE" and filed on Jun. 23, 2016, and a Continuation of U.S. patent application Ser. No. 15/191,410, entitled "PRESSURIZED HEATED ROLLING PRESS FOR MANUFACTURE AND METHOD OF USE" and filed on Jun. 23, 2016, both of which claim priority to and the benefit of U.S. Provisional Patent Application No. 62/184,712, entitled "PRESSURIZED HEATED ROLLING PRESS FOR MANUFACTURE AND METHOD OF USE" and filed on Jun. 25, 2015. Each of the above applications is incorporated by reference herein in its entirety.

FIELD OF THE INVENTION

The present invention relates generally to manufacturing techniques involving assemblies and more particularly to an improved method of manufacture for assembly including higher-yielding cell feeders, a pressure-controlled thermal treatment process and apparatus, and an improved assembly process for a high throughput system.

BACKGROUND OF THE INVENTION

Manufacturing processes which involve the assembly of components can be performed manually, automatically, or in combination, often in relation to the complexity of the manufacturing process. For instance, assembly processes that press a first component to a second component in a gluing operation often require compression resulting from force on the first component to the second component where an adhesive is affixed in advance in between. The steps involved in this basic assembly process can be simple or complex, in relation to the sensitivity, characteristics and nature of the components as well as the environment of the process itself. One method may involve a manual effort using a hand-guided light touch to press a first component onto the second to ensure that neither component is damaged based upon the experience of the operator manually performing the process. Another method may involve an automated robot device that is able to lift a first component from a tray and then align the first component over a second component having an adhesive coating, and press the first component onto the second component in relation to a control algorithm. Manual processes are often more difficult in environments that are caustic and high temperature, and often automated processes are difficult in processes that have delicate or sensitive components involved. Similarly, manual processes often are lower yield producing for higher-value components and automated processes having higher yields are often for lower-valued components. What is desired is an improvement to manufacturing processes that may produce higher yields of assembly where the assemblies include higher-valued and often sensitive components.

Often in the manufacturing of photovoltaic solar cells and photovoltaic solar cell components into photovoltaic devices such as solar mats, multiple laminate layers are applied to a carrier plate where both the contact and alignment are required to be precise and within particular pressure ranges as the components for example, solar cells are sensitive such that they may be easily broken or damaged during manufacture. As a result, often portions of assembly are manual with lower yields. Additionally, certain follow-on steps of the assembly process often involve high temperatures for curing the cell assemblies in which manual involvement may be dangerous or in some situations, impossible. As yields are sought to be improved, often more automated approaches are introduced which then create additional breakage or damage to the components during assembly, or in other situations, require additional steps to the existing processes which do not substantially reduce the processing times. With demand for photovoltaic cells increasing and the utility of the cells being incorporated into more commercial opportunities in varied markets worldwide, there is a need for improvements to the standard manufacturing assembly processes, in the photovoltaic cell area as well as other assembly areas, to improve the yield without increasing damage to sensitive components, to reduce the risks to those involved in the manual processes while incorporating an approach having a 'lighter-touch" in the assembly process, and to reduce the time to process steps in the assembly, safely.

SUMMARY OF THE INVENTION

A method and system for connecting a plurality of materials using pressure and curing is provided.

In one embodiment, a system for connecting a plurality of materials using pressure and curing comprises a flexible component feeder source for providing plurality of materials at first location; a vacuum conveyor for receiving the plurality of materials at the first location wherein the vacuum conveyor includes a plurality of openings for a predetermined vacuum to hold the plurality of materials in place on the vacuum conveyor; a moving belt is adaptively positioned above the vacuum conveyor at a second location and the vacuum conveyor and the moving belt are arranged to be driven in a predetermined relation to one another for conveying the received plurality of materials from the first location to a second location along the vacuum conveyor; a vacuum pressure source for applying a predetermined vacuum pressure from at least one of the plurality of openings towards the moving belt and the vacuum conveyor as the plurality of materials are conveyed from the second location to a third location, creating a force compressing the plurality of materials; and a curing source at a second location for curing the compressed plurality of materials.

In an embodiment, a method for connecting a plurality of materials using pressure and curing comprises receiving the plurality of materials on the vacuum conveyor at a first location wherein the vacuum conveyor includes a plurality of openings for a predetermined vacuum pressure to hold the plurality of materials in place on the vacuum conveyor; conveying the received plurality of materials from the first location to a second location along the vacuum conveyor, where a moving belt is adaptively positioned above the vacuum conveyor at the second location and the vacuum conveyor and the moving belt are arranged to be driven in a predetermined relation to one another; and applying a predetermined vacuum pressure from at least one of the plurality of openings towards the moving belt and the vacuum conveyor as the plurality of materials are conveyed from the second location to a third location, creating a force compressing the plurality of materials; and curing the compressed plurality of materials.

In a further embodiment, a flexible component feeder source comprising a flexible base suitable for protecting and receiving one or more photovoltaic cells for processing is provided. The feeder source, in a preferred embodiment, includes a base having a linear shape when opened and forms a roll when rolled.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 1 diagrams illustratively an approach for processing photovoltaic cells.

FIG. 5 diagrams a vacuum conveyor and a moving belt in relational arrangement when under pressure from a vacuum source such as a vacuum pump creating a downward pressure, in accordance with one or more embodiments of the present invention.

DETAILED DESCRIPTION

Figure 2B:
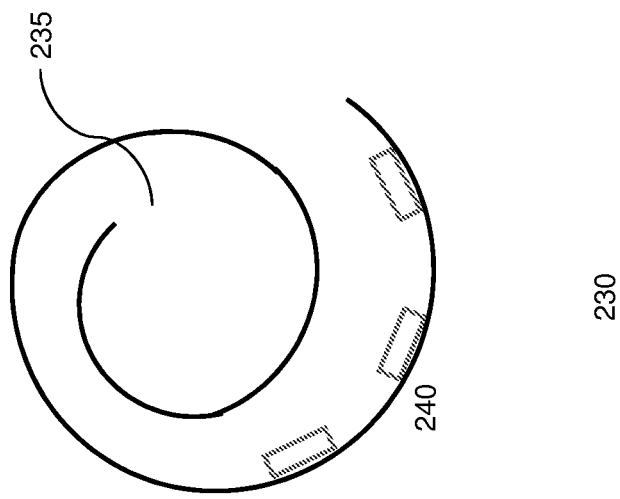
FIGS. 2A and 2B diagram a flexible tape feeder having a plurality of photovoltaic cells in accordance with one or more embodiments of the present invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

FIG. 1 diagrams illustratively an approach 100 for processing photovoltaic cells. From FIG. 1, a series of stacked cells 110 is located at the source of the approach 100 where each cell component is stacked in position to be processed in accordance with one of three processing lanes, 111a, 111b and 111c. Typically, the stacked cell components may be manually removed from the stacking and placed on a moving conveyor for processing. The stacked cells are often referred to as a 'coin stack' due to their physical arrangement. Human intervention is often necessitated due to the possibility of damage to the cells and the difficulty of the alignment of sensitive components by automated devices. Human intervention is also often necessitated as the cells are typically sticky or may have other material surface issues that require additional care in separating out the individual cells from one another in the coin stack. In certain situations, some automated equipment may be used in a limited manner though it should be realized that this process is typically a low speed process resulting in less than 10 parts per hour.

Once the components are aligned, the process proceeds to 120. At 120, the cells are prepared for pressure sensitive adhesion (PSA) step. The PSA step 130 may involve application of a pressure sensitive adhesive which when the component is placed into contact with another component or material, creates a bond wherein each of the two parts are securely affixed to one another. Once the PSA step is completed, the cells move to 125 for UV curing which may comprise curing using ultra-violet (UV) light (i.e., UV-cure tunnel).

At 140, the cells then move to a gluing step at 150. In some situations, one side of a cell may have adhesive applied to it, in other situations, adhesive may be applied to one or more component parts. Glue may be applied by hand or by equipment though the latter is often difficult. Once a gluing step is completed, the cells move to a shingling step 160.

At shingling step 160, the cells are coupled together through preferably a shingling process 170. The shingling process involves connecting the photovoltaic cells together. Examples of this process are described in U.S. application Ser. No. 13/397,487 which is assigned to the assignee of this application and incorporated in its entirety herein.

It is typical to place weights or apply other physical devices, such as rollers, to at least one of the component portions in order to create a secure bond between the two components. Using weights at 175, while typical, creates additional risks as the use of weights may cause sensitive components to be damaged or require further hardware replacement during operations which may be difficult or expensive. Alternatively, it is also known to use clamps to achieve a similar effect.

At 175, the cells are prepared for the curing step. The curing step 177 may involve ovens, and other thermal or light-based processes. Once the curing step is completed, the cell then moves to 180. At 180, the processing is completed for the affected photovoltaic cell and the completed photovoltaic cell results at 190.

As used herein, the term 'components' and 'materials' may include Gallium Arsenide (GaAs) based components or other photovoltaic components such as photovoltaic cells for example, flexible, thin-film photovoltaic devices comprising semiconductor material, which may or may not be single-crystal, including but not limited to Group III-V materials such as GaAs, AlGaAs, InGaAs, AlInGaAs, InGaAsP, InGaP, AlInGaP, and AlInP (and combinations thereof); Group IV materials such as Si, amorphous Si, Ge, SiGe; Group II-VI materials such as CdTe; other materials such as CIGS (Copper indium gallium (di)selenide), perovskites such as lead halides, organic semiconductors, CZTS, CZTSSe, and dye-sensitized photovoltaic absorber materials, and will typically be layered arrangements of materials which have one or more interface layers that promote a fixed arrangement as between the material layers following a processing sequence.

Examples of such materials, without limitation, may include photovoltaic cells, solar cells, solar panels, layered plastic components, electronic components, high density interconnects, chips, chips on flex, mixed composition materials having multiple layers arranged to be securely arranged with one another, and combinations thereof, for instance.

Figure 2A:
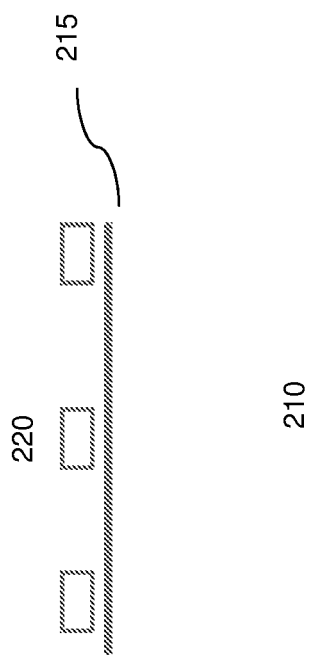

FIGS. 2A and 2B diagram a flexible tape feeder 210 having a plurality of photovoltaic cells 220 in connectable arrangement with the tape base 215, in accordance with one or more embodiments of the present invention. The tape feeder, or tape carrier, provides a source of components to be fed into the assembly or process of the present invention. The flexible tape feeder also provides a flexible backing to flexible cells to be assembled thereby reducing damage to the cells during feeding process. The use of the tape feeder is preferred over the coin stacking method as the tape feeder provides a reuse aspect, is more protective of the sensitive components arranged thereon, and is more efficient in the assembly operation. In an embodiment, the flexible tape feeder comprises any of polyethylene terephthalate (PET), porous materials including paper, cloth and a combination thereof.

Traditional operations use a coin stacking approach which requires a larger footprint in the assembly process and also does not protectably secure the sensitive devices to be processed. The tape feeder provides a linear flexible base 315 in which sensitive components 220 may be situated, protectively, for processing in the assembly process. The flexible base is of a linear shape when opened and forms a roll when rolled. Alternatively, the flexible base is of liner shape when under taught tension and retracts to a coil shape when tension to the base is absent.

In an embodiment, the linear base of the tape feeder at 230 may be arranged to provide for a coiling capability 235 where once a tape is populated with a plurality of sensitive components 240, the tape may be wound into the shape of a coil or roll. The coiled tape may then be placed at the beginning of the assembly process whereafter humans and/or robots may readily access the sensitive components situated thereon, removing them for processing. As the tape is fed for the process, the coiled arrangement requires less space and the tape may be rolled into a reusable stock tape during the process as each component is removed.

Figure 2D:
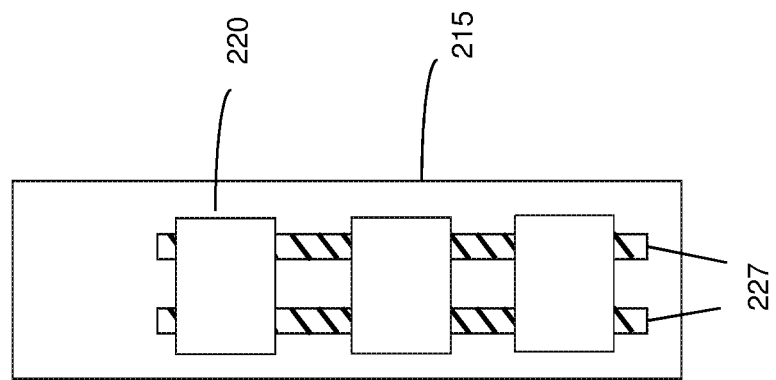
FIGS. 2C and 2D depict two methods for holding the photovoltaic cells in the tape feeder.
Figure 2C:
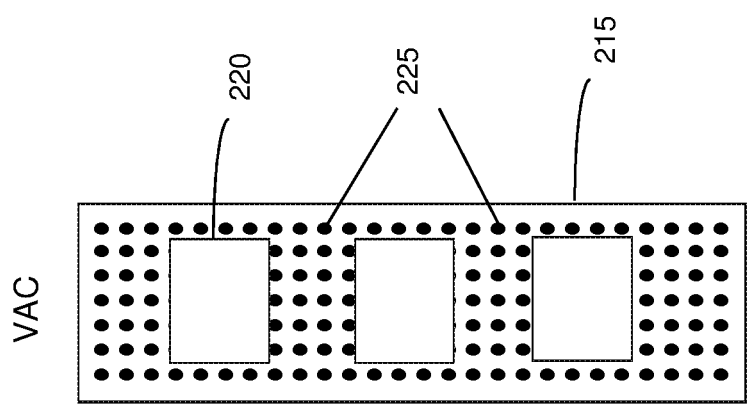

In an embodiment, a width of the flexible base is approximately similar to a size of the photovoltaic cells. In one or more preferred arrangements, instead of a few active lines of processing from traditional stacked cell arrangements involving trays, coin stacking and the like, the present invention provides for a six lane processing arrangement using only three tape rolls of components in which a single tape roll can be used to feed a plurality of active processing lanes. In this manner, the use of the tape feeder of the present invention also promotes a higher speed operation over the traditional approach. The photovoltaic cells can be carried by the tape feeder in a variety of ways. FIGS. 2C and 2D depicts two methods for holding the photovoltaic cells in the tape feeder. In a first embodiment shown in FIG. 2C a vacuum is applied through the openings 225 in the linear base 215 to hold the photovoltaic cells 220 in place.

In a second embodiment shown in FIG. 2D adhesive strips 227 on the linear base 215 are utilized to hold the photovoltaic cells 320 in place. One of ordinary skill in the art readily recognizes that either of or both of the methods together can be utilized to hold the photovoltaic cells 220 in place. For example, in one embodiment, the linear base can use a combination of strategically placed openings 225 and strategically placed adhesive strips 227 and that would be within the spirit and scope of the present invention. In an alternate embodiment, various other materials such as but not limited to adhesive pads, adhesive tape, glue, PSA, a mechanism to hold the photovoltaic cells in place or a combination of such materials/mechanisms can be used to hold the photovoltaic cells in place.

Figure 3:
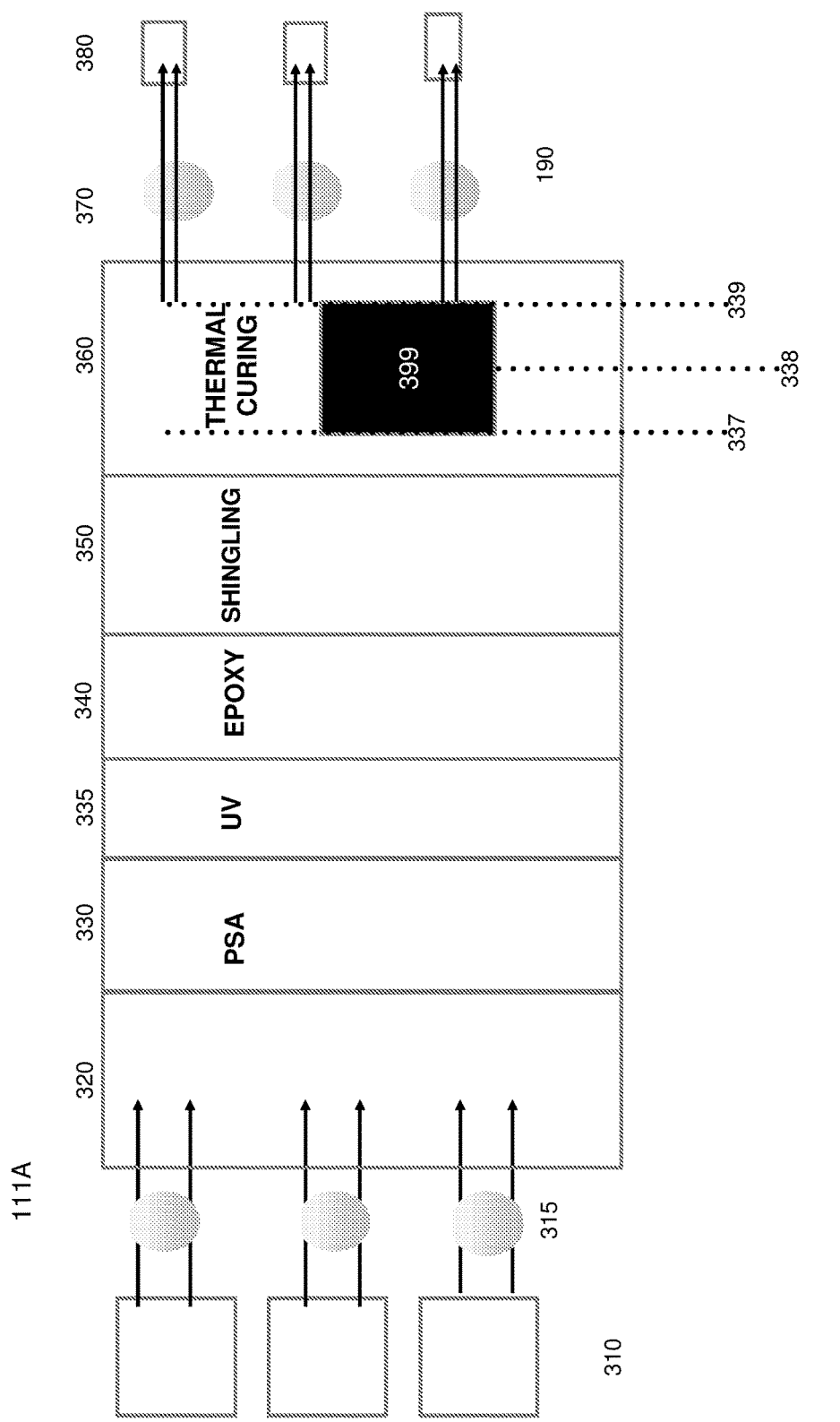
FIG. 3 diagrams a method of processing photovoltaic cells in accordance with one or more embodiments of the present invention.

FIG. 3 diagrams a method 300 of processing photovoltaic cells in accordance with one or more embodiments of the present invention. A tape feeder, described above, is situated at the beginning of a preferred assembly method at 310 as shown in FIG. 3. Preferably, automated equipment 315 removes the sensitive components (or materials) situated on the tape feeder and places them in a predetermined arrangement on the conveyor for processing at 320 corresponding to element 111A shown in FIG. 1. In one or more preferred embodiments, the automated equipment may stack two components that are to be securely arranged together atop one another, next to one another, or proximate to one another. The components are then prepped for the next phase of processing, which for exemplary purposes of FIG. 3 is a phase of receiving a PSA treatment at 330. At 330, the components are prepared and are arranged in layered form with an adhesive based interface between the arranged components as a layered component. The PSA step 330 may involve application of a pressure sensitive adhesive which when the component is placed into contact with another component or material, creates a bond wherein each of the two parts are securely affixed to one another. Once the PSA step is completed, the cells then move to 335 for UV curing which may comprise curing using ultra-violet (UV) light (i.e., UV-cure tunnel).

At 340, conductive epoxy, for example, is placed on one or more sides of at least one component to be processed and the components are arranged before the next step of shingling the components.

Thereafter the prepared photovoltaic cells are coupled together via shingling process 350. In one or more embodiments of the present invention, the next phase is a curing step in which an oven, conventional oven, convection oven, lamp-based source, or thermal source is used, though other possibilities are envisioned by the present invention. Curing could also be done by other methods, including but not limited to UV exposure, or evaporation of the solvent in air or in a vacuum, for example.

The layered component is then conveyed along a conveyor for thermal curing without the use of physical pressure plates or devices, in accordance with one or more preferred embodiments of the present invention. At 360, the layered component will traverse from a first location 337 to a second location 338 where at the second location the upper portion of the layered component will be under pressure from a surface of a moving belt in adaptable contact with the upper portion.

At the first location 337, the layered component is situated on the conveyor which in one or more preferred embodiments is a vacuum conveyor having a plurality of openings therein. Preferably the vacuum conveyor is also comprised of a durable material that provides rigidity and flexibility under pressure, such as being at least partly comprised of metal (SST, Al, etc.), high temp plastic, ceramic, granite, etc. As the layered material traverses from the first location to the second location, in an embodiment, a moving belt is situated above the conveyor and above the layered component. In an embodiment, the moving belt can be an idler belt or a driven belt situated above the conveyor and above the layered component. In an embodiment, the moving belt is not in contact with the layered component at the first location 337 but is in contact with the layered component at approximately the second location 338 and for a period of travel proximate thereto depending on the physical arrangement in one or more preferred embodiments. A pressure source, such as an air pump, vacuum pump, or pressurized air flow is positioned proximate to the idler belt or the driven belt and is adaptable and adjustable to control the flow of air from the air source to and across the idler belt or the driven belt and the vacuum conveyor, at 360. In one or more embodiments, a vacuum pump is controlled by a controller in which there are multiple zones of varying pressure between the second location 338 and the third location 339, for example.

At approximately the second location 338, in one or more preferred embodiments, the idler belt is in contact with the upper portion of the layered material. In operation, when no air pressure provided from the air source, the idler belt will be in 'non-pressured' contact with the upper surface of the layered material, resulting in the idler belt rolling at the same speed to that of the layered component due to the friction created. However, in operation, when there is active air pressure provided from the air source, the idler belt will be in 'pressured' contact with the upper surface of the layered material, resulting in the idler belt applying a pressure force to the upper portion of the layered material thereby forcibly pressuring the upper portion onto the lower portion. The rolling speed of the idler belt will act resistively towards the layered material though the speed may approximate a speed similar to that of the layered component due to the friction created. The idler belt will remain in non-pressured or pressured contact with the upper portion of the layered component until the layered component reaches a third location at 339. The user is able to adaptably adjust the amount of pressure a layered component receives based on the air source, the length of contact with the idler belt, and the environmental conditions of the process.

In an embodiment, the movement of the moving belt is controlled in relation to the time and pressure required for cure. Similarly, speed of conveyance of the vacuum conveyor, a speed of operation of the moving belt, a material composition of the vacuum conveyor, a material composition of the moving belt, and a length of travel the vacuum conveyor and the moving belt traverse between the second location and the third location is dependent upon temperature and time required for curing. In an embodiment, the moving belt can be an idler belt or a driven belt situated above the conveyor and above the layered component.

At the third location 339, the layered materials have been situated together based on the pressured or non-pressured contact. Depending on the layered materials of the process, the curing time of phase 360 may differ substantially and may also depend on the user's interest in achieving a full or partial cure for the layered material. For instance, where the layered materials are photovoltaic cells, the method of the present invention provides that approximately one minute per cell matrix would be a reasonable estimate of the curing time required, with a slightly longer time being required if a plurality of matrices is placed in parallel for instance, by example.

After the curing phase at 360, the finished layered components are cooled from the phase of curing, via active or passive cooling and are removed preferably by automated equipment at 370 corresponding to element 190 shown in FIG. 1. For clarity, while use of automated equipment is discussed and preferred in certain applications of the present invention, it is not required as the present invention is also capable of being operated without automated equipment and in an arrangement that is partly automated equipment and partly human interaction, without limitation.

Figure 4:
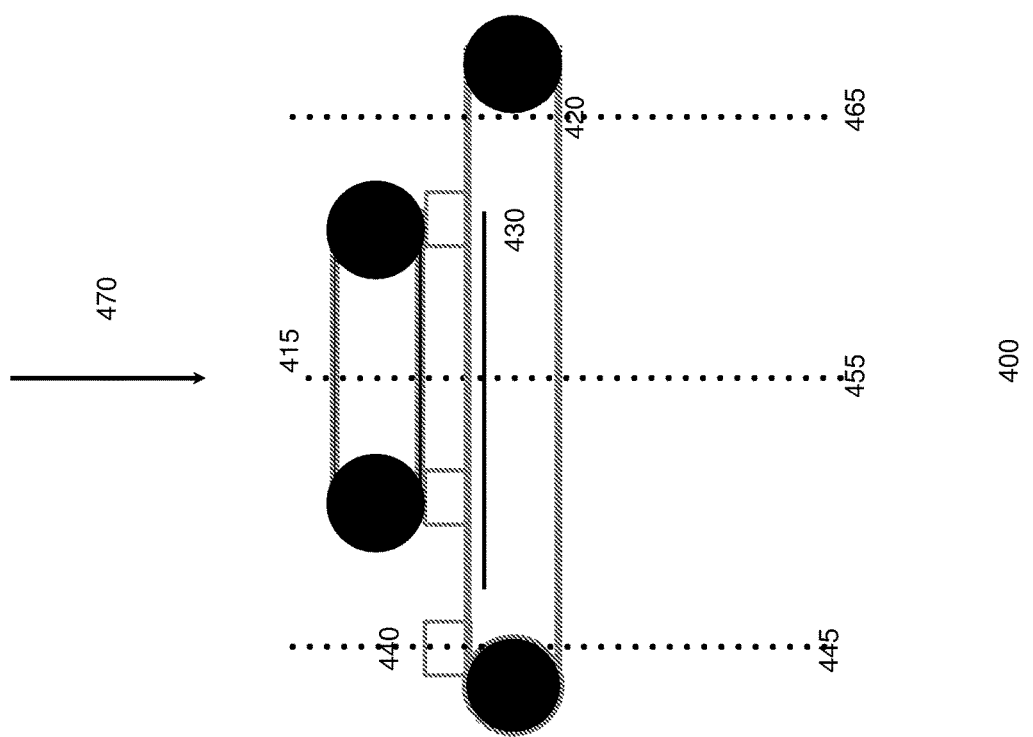
FIG. 4 diagrams a vacuum conveyor and a moving belt in relation arrangement in accordance with one or more embodiments of the present invention.

FIG. 4 diagrams a vacuum conveyor 420 and a moving belt 415 in relational arrangement at 400 in accordance with one or more embodiments of the present invention. In an embodiment, the moving belt can be an idler belt or a driven belt situated above the conveyor and above the layered component. As shown in FIG. 4, a multi-layer component is entering the drive arrangement 400 at 440 at a first location 445. The multi-layer component is situated on the conveyor (i.e., vacuum conveyor) 420 and is conveyed to a second point 455. At the second location 455, the moving belt 415, for example, an idler belt may be situated to be in non-pressurized or pressurized contact with the upper portion of the multi-layered component. After possible contact at the second location 455, the multi-layer component is continued to be conveyed along the vacuum conveyor to a third location 465.

As shown in FIG. 4 the vacuum conveyor 420 and the idler belt 415 may be driven by the same motor drive or controller; in another embodiment, the vacuum conveyor 420 and the idler belt 415 are driven independently. In a preferred arrangement the vacuum conveyor 420 is fabricated from steel. In a further preferred arrangement, a pressure plate is present at 430 which provides additional support to layered components on the surface of the vacuum conveyor 420 during a pressurized air flow.

FIG. 5 diagrams a vacuum conveyor 520 and a moving belt 515 in relational arrangement at 500 when under pressure from a vacuum source such as a vacuum pump creating a downward pressure, in accordance with one or more embodiments of the present invention. In an embodiment, the moving belt can be an idler belt or a driven belt situated above the conveyor and above the layered component. As shown in FIG. 5, a multi-layer component 540 is entering the drive arrangement 510 at a first location 545. The multi-layer component 540 is situated on the conveyor system (i.e. vacuum conveyor) 520 and is conveyed to a second location at 555. At the second location, the idler belt 515, in the example, is under pressure from a vacuum pump creating a pressurized force downwards such that the upper portion of the multi-layered component 540 is in contact with the idler belt 515. As the multi-layered component 540 is conveyed from the second location 555, the idler belt 515 applies pressure to the upper portion and the upper portion is compressed onto the lower portion which continues to ride along the vacuum conveyor 520 above a reinforcing plate preferably situated at 575, between the second location 555 and the third location 565. The force of the pressure may be adjusted by varying the vacuum pump, etc. After contact at the second location 555 and thereafter, the multi-layer component 540 is continued to be conveyed along the vacuum conveyor to the third location 565 where the contact to the upper portion from the idler belt 515 ceases and the compressed multi-layered component 540 is at a final stage at 580.

In an embodiment, the top of the arrangement 500 is heated by a tunnel oven 590 while the bottom of the arrangement 500 may either be heated, unheated or actively cooled as required by the process. In such an embodiment, temperature may be used to also facilitate the pressure adhesion process using the present invention.

In operation, in accordance with one embodiment, when there is no air pressure provided from the air source (or vacuum source), the idler belt will be in 'non-pressured' contact with the upper surface of the layered material, resulting in the idler belt rolling at a speed approximately similar to that of the layered component due to the friction created. In another embodiment, the idler belt is in adjustable contact with the upper portion based upon physical arrangement and air source pressure such that there is no contact with the upper portion absent an air source.

In an embodiment, the movement of the moving belt is controlled in relation to the time and pressure required for cure. Similarly, speed of conveyance of the vacuum conveyor, a speed of operation of the moving belt, a material composition of the vacuum conveyor, a material composition of the moving belt, and a length of travel the vacuum conveyor and the moving belt traverse between the second location and the third location is dependent upon temperature and time required for curing. In an embodiment, the moving belt can be an idler belt or a driven belt situated above the conveyor and above the layered component.

As is apparent from the above description, the present invention is able to achieve significant benefits in the area without the use of weights, clamps and rollers, or other physical devices which add additional wear and create potential damage to sensitive components being processed. Further the process is able to recognize improved throughput and speed in processing and further facilitates the deployment of automated equipment into environments that may be dangerous for human intervention.

Finally, it is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

What is claimed is:

1. A system for connecting photovoltaic cells, comprising:
a flexible component feeder source including a flexible base configured to receive the photovoltaic cells, wherein the flexible base of the flexible component feeder source is of a linear shape and forming into a coil shape after receiving the photovoltaic cells, and wherein the flexible component feeder source is configured to feed the photovoltaic cells to a shingling portion that couples together the photovoltaic cells generating coupled photovoltaic cells;
a vacuum conveyor for receiving at a first location the photovoltaic cells after being coupled together, wherein the vacuum conveyor includes a plurality of openings through which a vacuum is applied to hold the coupled photovoltaic cells in place on the vacuum conveyor;
a moving belt adaptively positioned above the vacuum conveyor at a second location, wherein the vacuum conveyor and the moving belt are arranged to be driven in a predetermined relation to one another for conveying the received coupled photovoltaic cells from the first location to the second location along the vacuum conveyor;
a vacuum source for applying a predetermined vacuum through at least one of the plurality of openings to cause the moving belt to apply a pressure to an upper surface of the coupled photovoltaic cells as the coupled photovoltaic cells are conveyed from the second location to a third location, wherein the pressure creates a force that compresses the coupled photovoltaic cells; and
a curing source at the second location for curing the compressed coupled photovoltaic cells.

2. The system of claim 1, wherein the coupled photovoltaic cells comprise at least an upper portion and a lower portion, and wherein the upper portion is layered atop the lower portion.

3. The system of claim 1, wherein the flexible base of the flexible component feeder source is configured to protect the photovoltaic cells for processing when formed into the coil shape.

4. The system of claim 1, wherein the flexible base of the flexible component feeder source is of the linear shape when under taut tension and retracts to the coil shape when tension to the flexible base is absent.

5. The system of claim 1, wherein the moving belt is an idler belt or a driven belt.

6. The system of claim 1, wherein the flexible component feeder source is configured to affix the photovoltaic cells on the flexible base after being received by the flexible base.

7. The system of claim 6, wherein the affixed photovoltaic cells are removable from where positioned on the flexible base of the flexible component feeder source to feed the photovoltaic cells to the shingling portion that couples together the photovoltaic cells.

8. The system of claim 6, further comprising an automated device that removes the affixed photovoltaic cells from where positioned on the flexible base of the flexible component feeder source.

9. The system of claim 6, wherein the affixed photovoltaic cells are configured to be manually removable from where positioned on the flexible base of the flexible component feeder source.

10. The system of claim 1, wherein each photovoltaic cell is protectably affixed on the flexible base of the flexible component feeder source to avoid damage and contact with one another when the flexible base is of the linear shape or of the coil shape.

11. The system of claim 1, wherein the flexible component feeder source is configured to be affixed with the photovoltaic cells on the flexible base using one or more of adhesive pads, an adhesive tape, a glue, a pressure sensitive adhesive (PSA), a physical mechanism to hold the photovoltaic cells in place, or a combination thereof.

12. The system of claim 11, wherein the affixed photovoltaic cells are removable from where positioned on the flexible base of the flexible component feeder source to feed the photovoltaic cells to the shingling portion that couples together the photovoltaic cells.

13. The system of claim 1, wherein the flexible component feeder source is configured to affix the photovoltaic cells on the flexible base using vacuum.

14. The system of claim 1, wherein the flexible base of the flexible component feeder source is reusable.

15. The system of claim 1, wherein a width of the flexible base of the flexible component feeder source is approximately similar to a size of one of the photovoltaic cells.

16. The system of claim 1, wherein the flexible base of the flexible component feeder source is one or more of polyethylene terephthalate (PET), paper, cloth, or a combination thereof.

17. The system of claim 1, wherein:
the coupled photovoltaic cells comprise at least an upper portion and a lower portion layered such that the upper portion is atop the lower portion, and
at least one of the upper portion or the lower portion includes one or more of an adhesive, an epoxy, or a securing material for securably affixing the upper portion and the lower portion to one another when the coupled photovoltaic cells are compressed.

18. The system of claim 1, wherein:
the vacuum conveyor is arranged in relation to the moving belt, and
the system further includes a supporting plate positioned beneath an upper conveying portion of the vacuum conveyor for additional support in conveying.

19. The system of claim 1, wherein the moving belt and the vacuum conveyor are operatively controlled by one or more controllers in relation to one another.

20. The system of claim 1, wherein:
the moving belt and the vacuum conveyor are an integrated unit, and
the system further includes a drive that is common to the vacuum conveyor and the moving belt.

21. The system of claim 20, wherein the drive that is common to the vacuum conveyor and the moving belt is driven by a plurality of gears adaptively arranged.

22. The system of claim 1, wherein the moving belt is configured to move freely.

23. The system of claim 1, wherein the moving belt is driven at a speed of operation that is configured to control movement in relation to a time and a pressure required for curing the coupled photovoltaic cells.

24. The system of claim 1, wherein one or more of a speed of conveyance of the vacuum conveyor, a speed of operation of the moving belt, a material composition of the vacuum conveyor, a material composition of the moving belt, and a length of travel the vacuum conveyor and the moving belt traverse between the second location and the third location are dependent upon a temperature and a time required for curing of the coupled photovoltaic cells.

25. The system of claim 1, wherein any one of the photovoltaic cells is one or more of:
Group III-V materials;
Group IV materials;
Group II-VI materials;
copper indium gallium (di)selenide (CIGS),
perovskites,
organic semiconductors,
CZTS,
CZTSSe, or
dye-sensitized photovoltaic absorber materials.

26. The system of claim 25, wherein the Group III-V materials is one or more of GaAs, AlGaAs, InGaAs, AlInGaAs, InGaAsP, InGaP, AlInGaP, AlInP, or a combination thereof.

27. The system of claim 25, wherein the Group IV materials is one or more of Si, amorphous Si, Ge, SiGe, or a combination thereof.

28. The system of claim 25, wherein the Group II-VI materials comprises CdTe.

29. The system of claim 25, wherein the perovskites comprise lead halides.

30. The system of claim 1, wherein the coupled photovoltaic cells include multiple photovoltaic cells which are aligned in a matrix.

31. The system of claim 1, wherein the second location is associated with a thermal curing step provided by the curing source.

32. The system of claim 31, wherein the thermal source is one or more of a conventional oven, a convection oven, a lamp-based thermal source, or a resistive heat source.

33. The system of claim 1, wherein the flexible component feeder source layers the coupled photovoltaic cells and include an upper portion and a lower portion that are fixably arranged after being compressed by the force created from the pressure applied by the moving belt.

34. The system of claim 33, wherein the coupled photovoltaic cells with the fixably arranged upper portion and lower portion are a finished coupled photovoltaic cells.

* * * * *